US011506814B2

(12) United States Patent
Su et al.

(10) Patent No.: US 11,506,814 B2
(45) Date of Patent: Nov. 22, 2022

(54) FRACTURING DESIGN METHOD AND DEVICE OF A HORIZONTAL WELL TO BE FRACTURED BASED ON FRACTURING POTENTIAL

(71) Applicant: China University of Petroleum (East), Shandong (CN)

(72) Inventors: Yuliang Su, Shandong (CN); Wendong Wang, Shandong (CN); Kaijie Zhang, Shandong (CN); Yongmao Hao, Shandong (CN); Bin Yuan, Shandong (CN); Qi Zhang, Shandong (CN)

(73) Assignee: CHINA UNIVERSITY OF PETROLEUM (EAST), Qingdao (CN)

( * ) Notice: Subject to any disclaimer, the term of this patent is extended or adjusted under 35 U.S.C. 154(b) by 62 days.

(21) Appl. No.: 16/975,660

(22) PCT Filed: Dec. 3, 2018

(86) PCT No.: PCT/CN2018/118848
§ 371 (c)(1),
(2) Date: Aug. 25, 2020

(87) PCT Pub. No.: WO2020/048028
PCT Pub. Date: Mar. 12, 2020

(65) Prior Publication Data
US 2020/0408952 A1 Dec. 31, 2020

(30) Foreign Application Priority Data
Sep. 3, 2018 (CN) .......................... 201811019267.X

(51) Int. Cl.
*G01V 99/00* (2009.01)
*G06F 30/13* (2020.01)
(Continued)

(52) U.S. Cl.
CPC ............ *G01V 99/005* (2013.01); *E21B 7/046* (2013.01); *E21B 43/26* (2013.01); *E21B 49/00* (2013.01);
(Continued)

(58) Field of Classification Search
CPC .......... G01V 99/005; G01V 2210/624; G01V 2210/646; E21B 7/046; E21B 43/26;
(Continued)

(56) References Cited

U.S. PATENT DOCUMENTS 4,828,028 A * 5/1989 Soliman .................. E21B 43/26
166/250.1
2019/0023979 A1 * 1/2019 Crews ...................... C09K 8/62

* cited by examiner

*Primary Examiner* — John E Johansen
(74) *Attorney, Agent, or Firm* — Standley Law Group LLP; Adam Smith

(57) ABSTRACT

Systems and methods for generating candidate designs and selecting a fracturing position design scheme for a horizontal well to be fractured based on fracturing potential are disclosed. A fracturing potential value of each designed fracturing point or each fracturing point is calculated using obtained values of various indexes of various depth points. A first corresponding relation between fracture conductivity value and the fracturing potential value and a second corresponding relation between a fracture half length and the fracturing potential value is determined. Corresponding first simulated production data for each candidate design is generated, and the candidate design with a highest predicted net present value is selected as the fracturing position design scheme which provides higher rationality and practicability to better guide development.

11 Claims, 6 Drawing Sheets

(51) Int. Cl.
 *E21B 7/04* (2006.01)
 *E21B 43/26* (2006.01)
 *E21B 49/00* (2006.01)
 *G06F 30/20* (2020.01)
(52) U.S. Cl.
 CPC .......... *G06F 30/13* (2020.01); *E21B 2200/20* (2020.05); *G01V 2210/624* (2013.01); *G01V 2210/646* (2013.01); *G06F 30/20* (2020.01)
(58) Field of Classification Search
 CPC ...... E21B 49/00; E21B 2200/20; G06F 30/13; G06F 30/20
 USPC .......................................................... 703/10
 See application file for complete search history.

FRACTURING DESIGN METHOD AND DEVICE OF A HORIZONTAL WELL TO BE FRACTURED BASED ON FRACTURING POTENTIAL

FIELD OF THE TECHNOLOGY

The present invention relates to the technical field of horizontal well fracturing design, especially relates to a fracturing design method and device of a horizontal well to be fractured based on fracturing potential.

BACKGROUND

At present, hydraulic fracturing of a horizontal well in the unconventional tight oil and gas exploitation process is an important means for improving effective utilization of a reservoir and improving the recovery ratio, and whether the design of a fracturing position and the length of a fracturing fracture is reasonable or not directly influences the oil and gas production and the final recovery ratio before fracturing is started. However, the lithology, physical properties and oil content of the compact reservoir has the characteristics of quick change, large difference, strong reservoir heterogeneity, and the development difficulty is high; the oil layer drilling rate is low, so that the volume fracturing optimization design of the horizontal well faces great challenges.

At present, the existing fracturing optimization design method has limitations, which mainly include: first, fracturing design can only be done in a uniform arrangement due to the lack of effective parameters that characterize the potential fracturing effect of the reservoir. When the heterogeneity of the reservoir is weak, the fracturing effect is not greatly influenced by the uniform arrangement of the fracturing points; however, when the heterogeneity of the reservoir is strong, the uniform arrangement causes the fractures generated by some fracturing points cannot meet the target requirement, and sometimes even can not to be fractured.

Secondly, a certain parameter or parameters are selected as references to design the fracturing positions, such as acoustic logging, gamma, natural potential, etc., although the parameters are not absolutely and uniformly arranged, the number and the positions of fracturing points are only roughly designed according to the size of the reference parameters, and the selection of the parameters is greatly limited, so that the final design result still has irrationality.

SUMMARY

In view of the above problems, the present invention provides a method and device for fracturing design of horizontal well to be fractured based on fracturing potential that overcomes or at least partially solves the above problems.

In a first aspect, an embodiment of the present invention provides a fracturing design method for a horizontal well to be fractured based on fracturing potential, including the following steps:

for the horizontal well to be fractured or each fractured horizontal well located in the same reservoir stratum with the horizontal well to be fractured: obtaining the value of each index of each depth point for calculating the fracturing potential value; calculating the fracturing potential value of each depth point by using the value of each index of each depth point to obtain the fracturing potential value of each design fracturing point or each fracturing point;

determining a first corresponding relation between a fracture conductivity value and a fracturing potential value and a second corresponding relation between a fracture half length and the fracturing potential value based on the fracturing potential value of each fracturing point of each fractured horizontal well and the first actual production data; the first actual production data comprises the oil production of the fracturing points at each time step;

for each candidate design of a plurality of design fracturing points of the horizontal well to be fractured, calculating a fracture conductivity value and a fracture half length of the design fracturing points according to the first corresponding relation, the second corresponding relation and the fracturing potential value of each design fracturing point, and generating the first simulated production data corresponding to the candidate design through a numerical simulator; the first simulated production data comprises simulated oil production and simulated water production of each time step corresponding to the candidate design;

calculating a predicted net present value corresponding to the candidate design according to the first simulated production data corresponding to the candidate design and the fracture half length of each design fracturing point; and determining the corresponding candidate design with the highest predicted net present value as the fracturing position design of the horizontal well to be fractured.

In an alternative embodiment, the step of calculating the fracturing potential value of each depth point by using the values of the index of each depth point comprises the following steps:

calculating the weight of each index according to the value of the index of each depth point; and for each depth point, calculating the fracturing potential value of the depth point according to the weight of each index of the depth point and the value of each index.

In an alternative embodiment, after obtaining the values of the index of each depth point for calculating the fracturing potential value for the horizontal well to be fractured or each fractured horizontal well located in the same reservoir stratum with the horizontal well to be fractured, the method further comprises the following steps:

for each index, judging the influencing trend of the index on the fracturing potential of the fractured horizontal well or the horizontal well to be fractured; determining whether the index is positive or negative according to the influencing trend;

calculating a dimensionless value of each index value corresponding to each depth point by using a range method according to the positive and negative directions of each index and the value of each index, wherein the dimensionless value is used as a standard value:

$$\begin{cases} y_{a,b} = \dfrac{x_{a,b} - \min(X_a)}{\max(X_a) - \min(X_a)} \text{(Index is positive)} \\ y_{a,b} = \dfrac{\max(X_a) - x_{a,b}}{\max(X_a) - \min(X_a)} \text{(Index is negative)} \end{cases}$$

Wherein, $y_{a,b}$ is the standard value of the index $a^{th}$ of the depth point $b^{th}$, and $b=1, 2 \ldots r$, r represents the number of the depth points, $a=1, 2 \ldots s$, s represents the number of the index terms, and r and s are both positive integers; $x_{a,b}$ is the value of the $a^{th}$ index of the $b^{th}$ depth point; $\max(X_a)$ and $\min(X_a)$ represent maximum and minimum values of the index values of the $a^{th}$ item corresponding to all depth points respectively.

In an alternative embodiment, the step of calculating the weight of the index according to the value of the index at each depth point comprises the following steps:

calculating the information entropy of the index according to the standard value of the index of each depth point; and calculating the entropy weight of each index as the weight according to the information entropy of each index.

In an alternative embodiment, the information entropy of the index is calculated according to the standard value of the index at each depth point as follows:

$$E_a = -\ln(r)^{-1} \sum_{b=1}^{r} p_{a,b} \ln p_{a,b}$$

wherein, $E_a$ is the information entropy of the index of the $a^{th}$ item;

$$p_{a,b} = y_{a,b} / \sum_{b=1}^{r} y_{a,b},$$

if $p_{a,b}=0$, then define $p_{a,b} \ln p_{a,b}=0$;

The weight of each index is calculated according to the information entropy of each index:

$$W_a = \frac{1 - E_a}{s - \sum_{a=1}^{s} E_a}$$

wherein, $W_a$ is the weight of the index of the $a^{th}$ item, $0 \leq W_a \leq 1$, and $$\sum_{a=1}^{s} W_a = 1.$$

In an alternative embodiment, the step of calculating the fracturing potential value for the depth point comprises the following step:

calculating the fracturing potential value for each of the depth points by using the following equation:

$$FP_b = \frac{\sum_{a1=1}^{s1} W_{a1}\left(\frac{P_{a1,b} - P_{min}^{a1}}{P_{max}^{a1} - P_{min}^{a1}}\right) + \sum_{s2=1}^{s2} W_{a2}\left(\frac{N_{a2,b} - N_{max}^{a2}}{N_{min}^{a2} - N_{max}^{a2}}\right)}{\sum_{a=1}^{s} W_a}$$

In the above equation, $FP_b$ represents the value of the fracturing potential at the $b^{th}$ depth point; $P_{a1,b}$ is the standard value of the positive index of the item $a1^{th}$ at the $b^{th}$ depth point, $P_{a1,b}=y_{a1,b}$, $N_{a2,b}$ represents the standard value of the negative index of the $a2^{th}$ item at the $b^{th}$ depth point, $N_{a2,b}=y_{a2,b}$ $a1=1, 2 \ldots s1$, s1 is the number of items of the positive index, $a2=1, 2 \ldots s2$, s2 is the number of items of the negative index, s 1+s 2=s; the subscripts max and min represent the maximum and minimum values of the standard values of the respective indices for all depth points respectively.

In an alternative embodiment, the step of determining the first corresponding relation between the fracture conductivity value and the fracturing potential value and the second corresponding relation between the fracture half length and the fracturing potential value based on the fracturing potential value of each fracturing point of each fractured horizontal well and the first actual production data, comprises the following steps:

for each fractured horizontal well, calculating the fracture half length of each fracturing point according to the first actual production data of each fracturing point of the fractured horizontal well; calculating the fracture conductivity value of each fracturing point according to the fracturing potential value and the fracture half length of each fracturing point of the fractured horizontal well; and training and learning are carried out on the basis of the fracture conductivity value and the fracturing potential value of each fracturing point of the fractured horizontal wells, and obtain the first corresponding relation between the fracture conductivity value and the fracturing potential value; and training and learning are carried out on the basis of the fracture half length and the fracturing potential value of each fracturing point of the fractured horizontal well to obtain a second corresponding relation between the fracture half length and the fracturing potential value.

In an alternative embodiment, the step of calculating the fracture half length of the fracturing points, comprises the following steps:

fitting each of the square root of the time corresponding to each time step in the first actual production data as an abscissa and the reciprocal of the oil production corresponding to the time step as an ordinate to obtain a fitting curve; calculating the slope m of the fitting curve; and calculating the fracture half length of the fracturing points using the following equation:

$$X_{i1} = 31.3 \frac{1}{\sqrt{k_{i1}}} \frac{B}{m_{i1} h_{i1} \Delta p_{i1}} \sqrt{\frac{\mu}{\phi_{i1} C_t}}$$

wherein, $X_{i1}$ is the fracture half length of the corresponding the $i1^{th}$ fracturing points, and $i1=1, 2 \ldots n1$, n1 represents the number of the fracturing points of the fractured horizontal well; $k_{i1}$, $\phi_{i1}$ and $h_{i1}$ respectively represent the permeability, porosity and reservoir thickness of the reservoir corresponding to the $i1^{th}$ fracturing points; $\Delta pi1$ is the difference between the bottom hole pressure of the fractured horizontal well and the reservoir pressure corresponding to the $i1^{th}$ fracturing points; $m_{i1}$ the slope corresponding to the $i1^{th}$ fracturing points; B is the volume coefficient of the crude oil of the target well section; $\mu$ is the viscosity of the crude oil of the target well section; $C_t$ is the comprehensive compression coefficient of the rock of the target well section.

In an alternative embodiment, the step of calculating the fracture conductivity value of each fracturing point according to the fracturing potential value and the fracture half length of each fracturing point of the fractured horizontal well, comprises the following steps:

establishing a plurality of candidate models of fracture conductivity values respectively according to the fracturing potential values of each fracturing point of the fractured horizontal well;

generating second simulated production data through a numerical simulator according to the fracture half length of each candidate model and each fracturing point; the second simulated production data comprises simulated oil production of the target well section of the fractured horizontal well at each time step;

calculating each of the fitting value of the second simulated production data and the second actual production data, and selecting a candidate model corresponding to the fitting value smaller than the preset fitting threshold as a selected model; and calculating the fracture conductivity value of each fracturing point of the fractured horizontal well according to the selected model.

In an alternative embodiment, the step of establishing a plurality of candidate models of fracture conductivity values, comprises the following step:

establishing a plurality of candidate fracture conductivity models of the fractured horizontal well:

$$CD_{i1}^m = \left(\frac{CD_{max} - CD_{min}}{FP_{max} - FP_{min}}(FP_{i1} - FP_c) + CD_c\right)$$

$$\left(1 + (-1)^{m-1} \frac{\text{round}\left(\frac{m-1}{2}\right)}{10}\right)(FP_{i1} > FP)$$

wherein, $CD_{i1}^m$ is the candidate value of fracture conductivity of the $i1^{th}$ fracturing points of the $m^{th}$ candidate model of the fractured horizontal well, m represents the serial number of the candidate model, m=1, 2 . . . , i1=1, 2 . . . n1, n1 represents the number of fracturing points of the fractured horizontal well; $CD_{max}$ and $CD_{min}$ represent the maximum value and the minimum value respectively of first calculation of the fracture conductivity value of all the fracturing points of the fractured horizontal well; $FP_{max}$ and $FP_{min}$ represent the maximum value and the minimum value of fracturing potential value of all fracturing points of the fractured horizontal well; $FP_{i1}$ is the fracturing potential value of the $i1^{th}$ fracturing points of the fractured horizontal well; $FP_c$ is the fracturing potential threshold of the reservoir; $CD_c$ is the predicted value of the base fracture conductivity.

In an alternative embodiment, the step of calculating a fitting value of each of the second simulated production data and the second actual production data, and selecting a candidate model corresponding to a fitting value smaller than a preset fitting threshold as a selected model, comprises the following steps:

for each candidate model with the sequence number increasing from 1: calculating a variance of the corresponding second simulated production data and second actual production data using the following equation:

$$\sigma_m = \sum_{j1=1}^{n2} (Q_{m,j1} - Q_{real,j1})^2$$

wherein, $\sigma_m$ is the variance of the second simulated production data and the second actual production data corresponding to the $m^{th}$ candidate model; j1 is the $j1^{th}$ time step, j1=1, 2 . . . n2, n2 is the total number of time steps; $Q_{m,j1}$ is the simulated oil production at the $j1^{th}$ time step in the second simulated production data; $Q_{real,j1}$ is the actual oil production at the $j1^{th}$ time step in the second actual production data; and selecting a first corresponding candidate model with the variance smaller than a preset fitting threshold as a selected model.

In an alternative embodiment, the step of training and learning are carried out based on the fracture conductivity value and the fracturing potential value of each fracturing point of the plurality of fractured horizontal wells, and obtaining the corresponding relation between the fracture conductivity value and the fracturing potential value, comprises the following steps:

training and learning are carried out based on the fracture conductivity value and the fracturing potential value of each fracturing point of the plurality of fractured horizontal wells, and the following learning results are obtained for multiple times:

$$CD_{i2}^{i3} = \theta_0 + \theta_{i3} FP_{i2}$$

wherein, $CD_{i2}^{i3}$ is the $i3^{th}$ learning value of the fracture conductivity corresponding to the $i2^{th}$ fracturing point, i3=1, 2 . . . , i2=1, 2 . . . n3, n3 is the number of fracturing points of the plurality of fractured horizontal wells and n3≥n1; $\theta_0$ is a constant; $\theta_{i3}$ is the equation coefficients required to be determined for the $i3^{th}$ learning; $FP_{i2}$ is the fracturing potential value of the $i2^{th}$ fracturing point.

The equation coefficient $\theta_{i3}$ to be determined for the $i3^{th}$ learning is obtained by the following equation:

$$\theta_{(i3)+1} = \theta_{i3} - \alpha \frac{\partial J(\theta_{i3})}{\partial \theta_{i3}}$$

wherein, $\theta_1 = \theta_{00}$, $\theta_{00}$ is a constant, representing the initial equation coefficient; $J(\theta_{i3})$ is the loss function of the $i3^{th}$ learning, and the loss function is specifically calculated by the following equation:

$$J(\theta_{i3}) = \frac{1}{2} \sum_{i2=1}^{n3} (CD_{i2}^{i3} - CD_{i2})^2$$

wherein, $CD_{i2}$ represents the fracture conductivity value of the $i2^{th}$ fracturing point.

When minimum value is determined by the loss function, the corresponding learning result is the corresponding relation between the fracture conductivity and the fracturing potential value.

In an alternative embodiment, the step of determining the correspondence between the fracture half length and the fracturing potential value, comprises the following step:

training and learning are carried out based on the fracture half length and the fracturing potential value of each fracturing point of the fractured horizontal well, and the following learning results are obtained for multiple times:

$$X_{i5}^{i4} = \beta_0 + \beta_{i4} FP_{i5}$$

wherein, $X_{i5}^{i4}$ is the $i4^{th}$ learning value of fracture half length corresponding to the $i5^{th}$ fracturing points, i4=1, 2 . . . , i5=1, 2 . . . n4, n4 is the number of the fracturing points for learning, and n4≥n1; $\beta_0$ is a constant; $\beta_{i4}$ is the equation coefficient to be determined for the $i4^{th}$ learning; $FP_{i5}$ represents the fracturing potential value at the $i5^{th}$ fracturing point.

The equation coefficient $\beta_{i4}$ to be determined for the $i4^{th}$ learning is obtained by the following equation:

$$\beta_{(i4)+1} = \beta_{i4} - \alpha \frac{\partial J(\beta_{i4})}{\partial \beta_{i4}}$$

wherein, $\beta_1=\beta_{00}$, $\beta_{00}$ is a constant, representing initial equation coefficient; $J(\beta_{i4})$ is the loss function of $i4^{th}$ learning, the loss function is obtained by the following equation:

$$J(\beta_{i4}) = \frac{1}{2} \sum_{i5=1}^{n4} (X_{i5}^{i4} - X_{i5})^2$$

wherein, $X_{i5}$ is the fracture half length at the $i5^{th}$ fracturing points.

When the minimum value is obtained by the loss function, the corresponding learning result is the corresponding relation between the fracture half length and the fracturing potential value.

In an alternative embodiment, the step of calculating a predicted net present value corresponding to the candidate design, comprises the following step:

calculating a predicted net present value corresponding to the candidate design using the following equation:

$$NPV = \sum_{j2=1}^{n5} \left( \frac{(Q_o^{j2} r_g - Q_w^{j2} r_w) \Delta t_{j2}}{(1+b)^{\frac{t_{j2}}{365}}} \right) - \sum_{i6=1}^{n6} 2X_{i6} C$$

wherein, NPV is the predicted net present value corresponding to the candidate design, j2 is the $j2^{th}$ time step of the first simulated production data, j2=1, 2 ... n5, n5 is the number of time steps in the first simulated production data; $r_g$ and $r_w$ represent the price of oil per unit volume and the price of water per unit volume to be treated respectively; $t_{j2}$ is the time point corresponding to the $j2^{th}$ time step; $\Delta t_{j2}$ is the time step length; b is the discount rate; C is the fracturing cost per unit fracture length; $Q_o^{j2}$ and $Q_w^{j2}$ represent the simulated oil production and the simulated water production of the $j2^{th}$ time step in the first simulated production data respectively; $X_{i6}$ is the fracture half length of the $i6^{th}$ design fracturing point, i6=1, 2 ... n6, n6 is the number of design fracturing points corresponding to the candidate design.

In a second aspect, an embodiment of the present invention provides a fracturing horizontal well fracturing design device based on fracturing potential, comprising:

a first calculation module used for the horizontal well to be fractured or each fractured horizontal well which is positioned in the same reservoir with the horizontal well to be fractured: obtaining the value of each index of each depth point for calculating the fracturing potential value; calculating the fracturing potential value of each depth point by using the value of each index of each depth point to obtain the fracturing potential value of each designed fracturing point or each fracturing point;

a determination module used for determining the first corresponding relation between the fracture conductivity value and the fracturing potential value and the second corresponding relation between the fracture half length and the fracturing potential value based on the fracturing potential value and the first actual production data of each fracturing point of each fractured horizontal well calculated by the first calculating module; the first actual production data comprises the oil production of the fracturing point at each time step;

a simulation module used for calculating the fracture conductivity value and the fracture half length of the designed fracturing points according to the first corresponding relation and the second corresponding relation determined by the determination module and the fracturing potential value of each designed fracturing points calculated by the first calculation module for each candidate design of the multiple designed fracturing points of the horizontal well to be fractured, and generating first simulated production data corresponding to the candidate design through a numerical simulator; the first simulated production data comprise simulated oil production and simulated water production of each time step corresponding to the candidate design;

a second calculation module used for calculating a predicted net present value corresponding to the candidate design according to the first simulated production data corresponding to the candidate design obtained by the simulation module and the fracture half length at each design fracturing point; and a selection module used for determining the candidate design with the highest predicted net present value calculated by the second calculation module as the fracturing position design scheme of the horizontal well to be fractured.

In an alternative embodiment, the first calculating module is specifically used for:

for each index, calculating the weight of the index according to the value of the index of each depth point; and for each depth point, calculating the fracturing potential value of the depth point according to the weight and the value of each index of the depth point.

In an alternative embodiment, the determination module is specifically used for:

for each fractured horizontal well, calculating the fracture half length of each fracturing point according to the first actual production data of each fracturing point of the fractured horizontal well; calculating the fracture conductivity value of each fracturing point according to the fracturing potential value and the fracture half length of each fracturing point of the fractured horizontal well; and training and learning based on fracture conductivity values and fracturing potential values of each fracturing point of a plurality of fractured horizontal wells to obtain a first corresponding relation between the fracture conductivity values and the fracturing potential values; and training and learning based on the fracture half length and the fracturing potential value of each fracturing point of the plurality of fractured horizontal wells to obtain a second corresponding relation between the fracture half length and the fracturing potential value.

In an alternative embodiment, the determination module is specifically used for:

fitting each point which takes the square root of the time corresponding to each time step in the first actual production data as a horizontal coordinate and the reciprocal of the oil production corresponding to the time step as a vertical coordinate to obtain a fitting curve; calculating the slope m of the fitting curve; and calculating the fracture half length at the fracturing points by using the following equation:

$$X_{i1} = 31.3 \frac{1}{\sqrt{k_{i1}}} \frac{B}{m_{i1} h_{i1} \Delta p_{i1}} \sqrt{\frac{\mu}{\phi_{i1} C_t}}$$

wherein, $X_{i1}$ is the corresponding half length of fracture of the $i1^{th}$ fracturing point, $i1=1, 2 \ldots n1$, $n1$ is the number of fracturing points of the fractured horizontal well; $k_{i1}, \phi_{i1}, h_{i1}$ are permeability, the porosity and the oil reservoir thickness of the corresponding reservoir to the $i1^{th}$ fracturing point respectively; $\Delta pi1$ is the difference between the bottom hole pressure of the fractured horizontal well and the reservoir pressure corresponding to the $i1^{th}$ fracturing point; $m_{i1}$ is the slope corresponding to the $i1^{th}$ fracturing point; B is the crude oil volume coefficient of the target well section; $\mu$ is the crude oil viscosity of the target well section; $C_t$ is the rock comprehensive compression coefficient of the target well section.

In an alternative embodiment, the determination module is specifically used for:

establishing a plurality of candidate models of the fracture conductivity values respectively according to the fracturing potential value of each fracturing point of the fractured horizontal well;

generating second simulated production data through a numerical simulator according to the fracture half length of each candidate model and each fracturing point respectively; the second simulated production data comprises simulated oil production at each time step of the target well section of the fractured horizontal well;

calculating each fitting value of the second simulated production data and the second actual production data, and selecting a candidate model corresponding to the fitting value less than a preset fitting threshold value as a selected model; and calculating the fracture conductivity value of each fracturing point of the fractured horizontal well according to the selected model.

In an alternative embodiment, the second calculation module is specifically used for:

calculating a predicted net present value for the candidate design using the equation:

$$NPV = \sum_{j2=1}^{n5} \left( \frac{(Q_o^{j2} r_g - Q_w^{j2} r_w) \Delta t_{j2}}{(1+b)^{\frac{t_{j2}}{365}}} \right) - \sum_{i6=1}^{n6} 2 X_{i6} C$$

wherein, NPV is the predicted net present value corresponding to candidate design; $j2$ is the $j2^{th}$ time step of the first simulated production data, $j2=1, 2 \ldots n5$, $n5$ is number of time steps in first simulated production data; $r_g$ and $r_w$ are the price of oil per unit volume and the price of water per unit volume to be treated respectively; $t_{j2}$ is the time point corresponding to the $j2^{th}$ time step; $\Delta t_{j2}$ is the length of the time step; $b$ is the discount rate; $C$ is the fracturing cost per unit length of fracture; $Q_o^{j2}$ and $Q_w^{j2}$ represent the simulated oil production and the simulated water production at the $j2^{th}$ time step in the first simulated production data respectively; $x_{i6}$ is the fracture half length of the $i6^{th}$ design fracturing point, $i6=1, 2 \ldots n6$, $n6$ is the number of design fracturing points corresponding to the candidate design.

In a third aspect, embodiments of the present invention provide a computer-readable storage medium, on which computer instructions are stored, and when the instructions are executed by a processor, the fracturing design method for a horizontal well to be fractured based on fracturing potential is implemented.

The above technical schemes provided by the embodiments of the present invention at least have the following beneficial effects:

1. The scheme takes the predicted net present value as the selection standard of the fracturing position design scheme, rather than the traditional method of uniformly arranging fracturing points, the finally designed scheme has higher rationality and practicability, and can better guide the development.

2. The values of all indexes of all depth points of the horizontal well to be fractured or each fractured horizontal well for fracturing potential value calculation are obtained, and all indexes influencing the fracturing potential can be contained, so that all influencing factors can be comprehensively analyzed, the computed fracturing potential value can better reflect the heterogeneity of the reservoir and the fracturing potential of the reservoir can be more reasonably represented.

3. Determining the first corresponding relation between the fracture conductivity value and the fracturing potential value and the second corresponding relation between the fracture half length and the fracturing potential value based on the fracturing potential value and the first actual production data of each fracturing point of each fractured horizontal well. According to the first corresponding relation, the second corresponding relation and the fracturing potential value of each depth point of the horizontal well to be fractured, the fracture conductivity value and the fracture half length can be calculated, and a data basis is provided for fracturing design.

4. In the process of calculating the fracturing potential value, for each index, calculating the weight of the index according to the value of the index of each depth point; further calculating the fracturing potential value of the depth point according to the weight and the value of each index of the depth point, so that the calculated fracturing potential value of each depth point is a result of the joint influence of each index; therefore, the calculation result of the final fracturing potential value has higher reasonability, accuracy and practicability. Furthermore, the fracture flow guiding capacity value calculated by taking the fracturing potential value as basic data has higher accuracy and practicability, and can better guide development.

5. The calculation of the fracture conductivity value of the fractured horizontal well is performed through a selected model of which the fitting value of the second simulated production data and the second actual production data are less than the preset fitting threshold value, so that the accuracy of the calculated fracture conductivity value is high; therefore, the corresponding relation between the fracture conductivity value and the fracturing potential value is obtained through learning, and the finally calculated fracture conductivity value of each data point of the horizontal well to be fractured is high in accuracy and high in rationality, and an effective data base is provided for fracturing design of the horizontal well to be fractured.

The technical solution of the present invention is further described in detail below through the drawings and embodiments.

BRIEF DESCRIPTION OF THE DRAWINGS

The drawings are intended to provide a further understanding of the present invention and are part of the description and explain the present invention together with the embodiments of the present invention. The drawings are not intended to limit the present invention. In the drawings.

DETAILED DESCRIPTION

Figure 1:
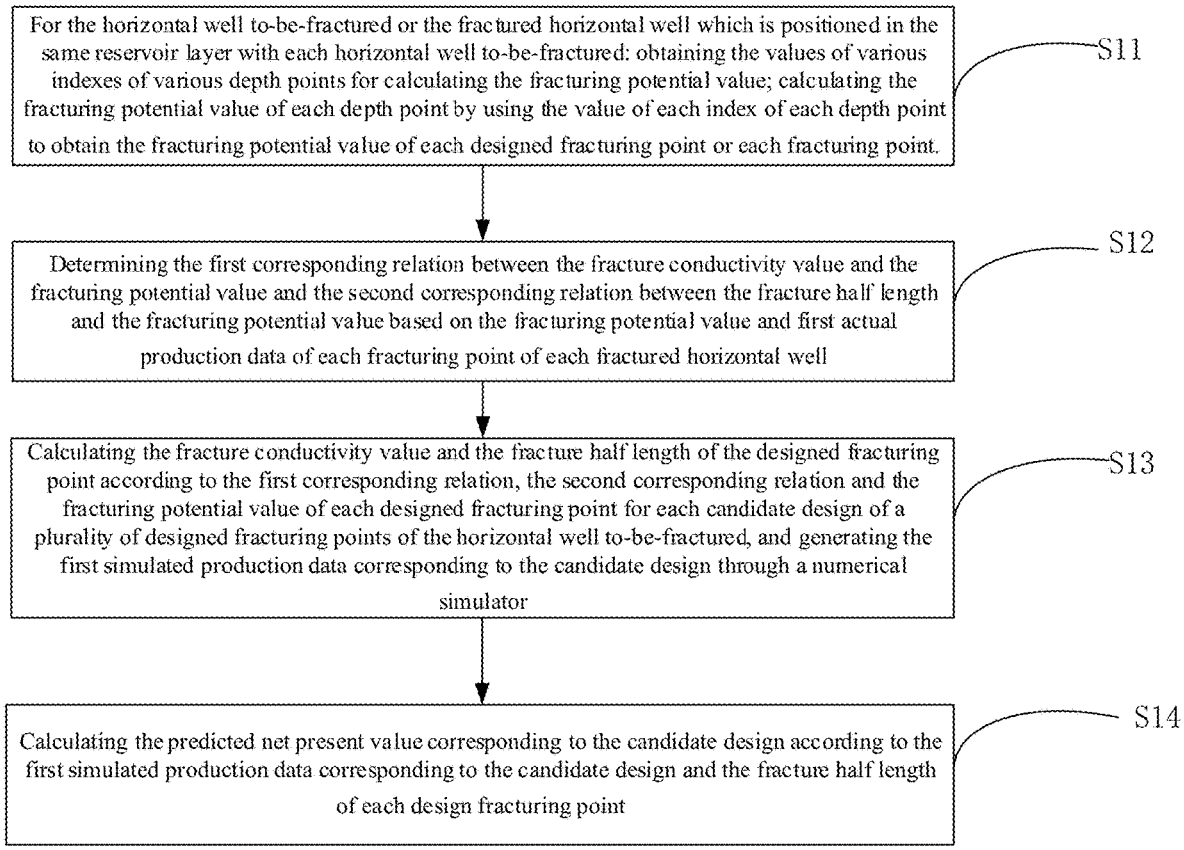
FIG. 1 is a flowchart of the fracturing design method of the to-be-fractured horizontal well based on the fracturing potential described in embodiment 1 of the present invention.

Exemplary embodiments of the present invention will be described in more details below with reference to the accompanying drawings. While exemplary embodiments of the present invention are shown in the drawings, it should be understood that the present invention may be embodied in various forms and should not be limited to the embodiments set forth herein. Rather, these embodiments are provided so that the present invention will be thorough and complete, and will fully convey the scope of the present invention to those skilled in the art.

In order to solve the problem that the fracturing position of the existing horizontal well is unreasonably designed, the embodiment of the present invention provides a fracturing design method based on fracturing potential for the horizontal well to be fractured, the design takes the predicted net present value as the selection standard, and the final design has higher rationality and practicability and can better guide the development Embodiment 1

Figure 2:
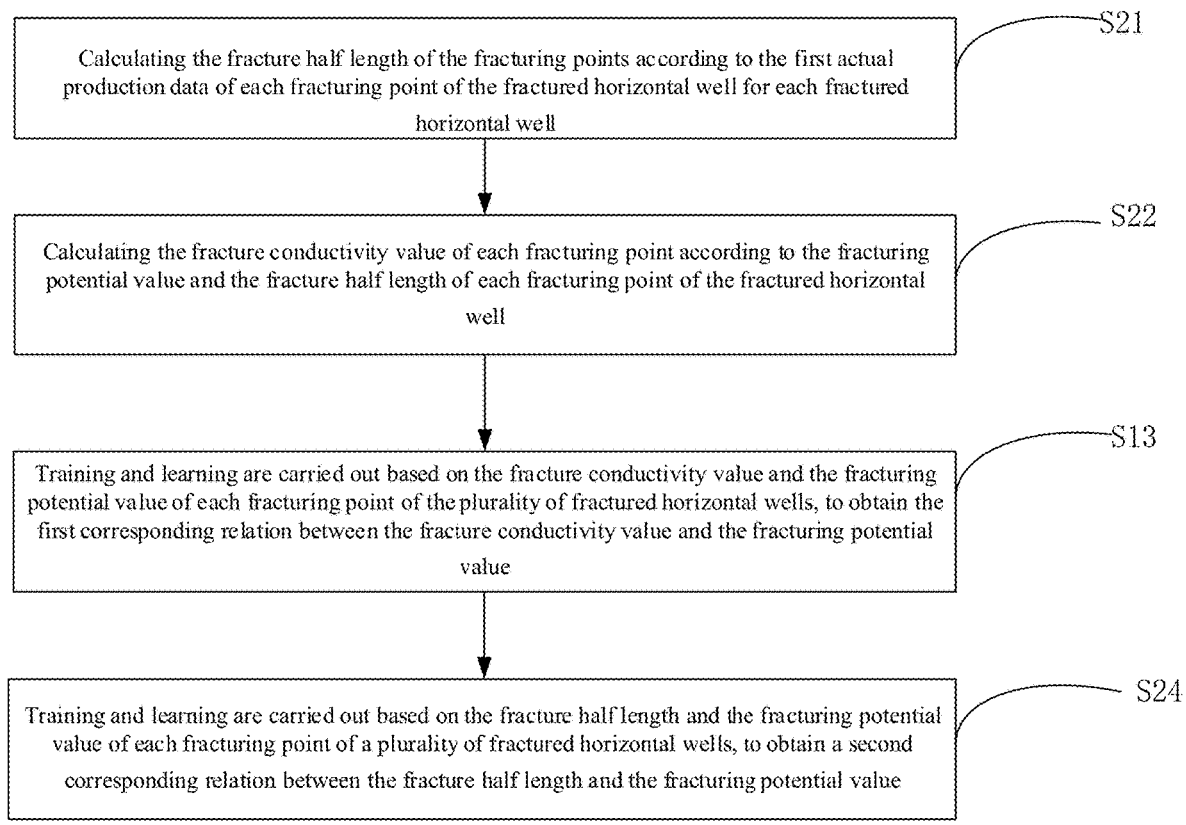
FIG. 2 is a flowchart of the first corresponding relation between the value of the fracture conductivity and the value of fracturing potential, the second corresponding relation between the fracture half length and the value of the fracturing potential described in embodiment 2 of the present invention.

The embodiment 1 of the present invention provides a method of a horizontal well to be fractured based on fracturing potential, the workflow of which is shown in FIG. 2, and the method comprises the following steps:

Step S11: for the horizontal well to be fractured or the fractured horizontal well which is positioned in the same reservoir layer with each horizontal well to be fractured: obtaining the values of various indexes of various depth points for calculating the fracturing potential value; calculating the fracturing potential value of each depth point by using the value of each index of each depth point to obtain the fracturing potential value of each designed fracturing point or each fracturing point.

Here, the horizontal well to be fractured is a horizontal well which is not subjected to fracturing construction and needs fracturing design and the fracturing design in the present invention mainly refers to the number and positions of designed fracturing points; a fractured horizontal well refers to a horizontal well that has been fractured and placed into production.

Specifically, for each index, the weight of the index is calculated according to the value of the index at each depth point; for each depth point, calculating the fracturing potential value of the depth point according to the weight and the value of each index of the depth point.

The data points can be set according to the intervals of the logging sampling rate of the target well section at, i.e., intervals of 0.125 meters. The target well section refers to a preliminary evaluation of a well section with fracturing potential in the reservoir stratum for the horizontal well to be fractured, and the number and the positions of fracturing points are designed in the target well section; for a fractured horizontal well, the target well section refers to the well section containing all the fracturing points in the reservoir.

After the fracturing potential values of the depth points of the horizontal well to be fractured or each fractured horizontal well are calculated, the fracturing potential values of the design fracturing points of the horizontal well to be fractured or the fracturing points of the fractured horizontal well can be further obtained.

The concrete calculation method of the fracturing potential value is described in details in the embodiment 3.

Step S12: determining the first corresponding relation between the fracture conductivity value and the fracturing potential value and the second corresponding relation between the fracture half length and the fracturing potential value based on the fracturing potential value and first actual production data of each fracturing point of each fractured horizontal well.

Wherein the first actual production data comprises the oil production of the fracturing point at each time step.

Specifically, the determination of the first corresponding relation and the second corresponding relation is described in detail in the following embodiment 2.

Step S13: calculating the fracture conductivity value and the fracture half length of the designed fracturing point according to the first corresponding relation, the second corresponding relation and the fracturing potential value of each designed fracturing point for each candidate design of a plurality of designed fracturing points of the horizontal well to be fractured, and generating the first simulated production data corresponding to the candidate design through a numerical simulator.

Wherein the first simulated production data comprises simulated oil production and simulated water production at each time step corresponding to the candidate design.

Wherein each candidate design comprises the number and location of design fracturing points. Each candidate design may be directly selected, or may be generated according to certain rules on the basis of certain data. For example, different fracture distribution scheme may be generated according to the rules shown in Table 1 based on the distribution of fracturing potential values of the target well section.

TABLE 1

Fracture Position Design Rules

| Range of fracturing potential values | Reference distance between sections/m |
|---|---|
| ≥0.42 | 10a |
| 0.36 ≤ FP < 0.42 | 20a |
| 0.27 ≤ FP < 0.36 | 30a |
| FP < 0.27 | Not considered as the fracturing site |

In table 1, a is a coefficient, an integer is taken, the minimum value is 1, and the values of a are different, so that fracture distribution schemes with different designed fracturing points and positions can be obtained. Taking a=1 as an example, starting from the shallowest or deepest part of the target well section, designing a depth point with the first fracturing potential value being greater than or equal to 0.27 as a first designed fracturing point; judging the range of the fracturing potential value at the first designed fracturing point, if the range is greater than or equal to 0.27 but less than 0.36, continuously and sequentially searching depth points which are greater or equal to 30 meters away from the first designed fracturing point and have the fracturing potential value of greater than or equal to 0.27 as the second designed fracturing point; if the range of the fracturing potential value at the first designed fracturing point is greater than or equal to 0.36 but less than 0.42, continuously and sequentially searching depth points which are greater or equal to 20 meters away from the first designed fracturing point and have the fracturing potential value of greater or equal to 0.27 as the second designed fracturing point; if the range of the fracturing potential value of the first designed fracturing point is greater than or equal to 0.42, the distance between the first designed fracturing point and the first designed fracturing point is continuously and sequentially searched, and the depth point with the fracturing potential value greater than or equal to 0.27 is designed as a second designed fracturing point . . . . And so on, until reaching the other end of the target well section.

The data base of the fracturing position design reference above can be other data; the specific rule may be other rules, and the embodiments of the present invention are not limited thereto.

Calculating the fracture conductivity value and the fracture half length of each designed fracturing point, specifically, calculating the fracture conductivity value of each designed fracturing point by using the first corresponding relation between the fracture conductivity value and the fracturing potential value of each designed fracturing point; calculating the fracture half length of the designed fracturing point by using the second corresponding relation between the fracture half length and the fracturing potential value of each designed fracturing point.

Step S14: calculating the predicted net present value corresponding to the candidate design according to the first simulated production data corresponding to the candidate design and the fracture half length of each design fracturing point.

Specifically, the predicted net present value corresponding to the candidate design may be calculated using the following equation (1):

$$NPV = \sum_{j2=1}^{n5} \left( \frac{(Q_o^{j2} r_g - Q_w^{j2} r_w) \Delta t_{j2}}{(1+b)^{\frac{t_{j2}}{365}}} \right) - \sum_{i6=1}^{n6} 2X_{i6}C \quad (1)$$

In the above equation (1), NPV is the predicted net present value corresponding to candidate design; j2 is the $j2^{th}$ time step of the first simulated production data, j2=1, 2 . . . n5, n5 is number of time steps in first simulated production data; $r_g$ and $r_w$ are the price of oil per unit volume and the price of water per unit volume to be treated respectively; $t_{j2}$ is the time point corresponding to the $j2^{th}$ time step; $\Delta t_{j2}$ is the length of the time step; b is the discount rate; C is the fracturing cost of per unit fracturing length; $Q_o^{j2}$ and $Q_w^{j2}$ are the simulated oil production and the simulated water production at the $j2^{th}$ time step in the first simulated production data respectively; $x_{i6}$ is the fracture half length of the $i6^{th}$ design fracturing point, i6=1, 2 . . . n6, n6 is the number of design fracturing points corresponding to the candidate design.

Step S15: determining the corresponding candidate design with the highest predicted net present value as the fracturing position design scheme of the horizontal well to be fractured.

In the embodiment 1 of the present invention, the predicted net present value is taken as the selection standard of the fracturing design scheme, rather than the traditional method of uniformly arranging fracturing points, the final designed scheme has higher rationality and practicability, and can better guide the development.

Obtaining the values of the various index values of the depth points to be fractured or each fractured horizontal well for the calculation of the fracturing potential value, all index having an influence on the fracturing potential can be included. Therefore, the influencing factors can be analyzed comprehensively, and the calculated fracturing potential value can better reflect the heterogeneity of the reservoir and more rationally characterize the fracturing potential of the reservoir.

Determining the first corresponding relation between the fracture conductivity value and the fracturing potential value and the second corresponding relation between the fracture half length and fracturing potential based on the fracturing potential value and the first actual production data of each fracturing point of each fractured horizontal well. According to the first corresponding relation, the second corresponding relation and the fracturing potential value of each depth point of the horizontal well to be fractured, the fracture conductivity value and the fracture half length can be calculated, which provides the data basis for the fracturing design.

Embodiment 2

The embodiment 2 of the present invention provides a method of determining the first corresponding relation between the fracture conductivity value and the fracturing potential value, and the second corresponding relation between the fracture half length and the fracturing potential value, the workflow of which is shown in FIG. 2, and the method comprises the following steps:

Step S21: calculating the fracture half length of the fracturing points according to the first actual production data of each fracturing point of the fractured horizontal well for each fractured horizontal well.

Specifically, it may be, fitting each of the square root of the time corresponding to each time step in the first actual production data as an abscissa and the reciprocal of the oil production corresponding to the time step as an ordinate to obtain a fitting curve; calculating the slope m of the fitting curve.

Figure 3:
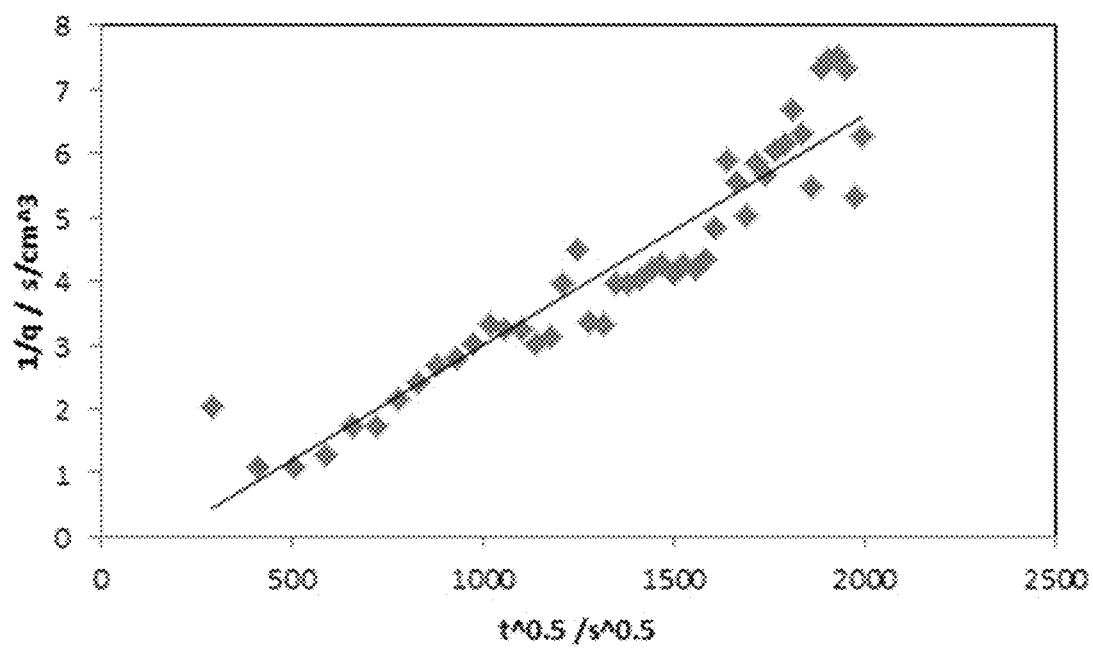
FIG. 3 is a flowchart of the realization of the slope used to calculate the fracture half length at the fracturing point in step S21 of embodiment 2 of the present invention.

As shown in FIG. 3, the oil production amount corresponding to one day as each time step is obtained from the first actual production data; the time unit corresponding to each time step after the production is sequentially converted into seconds, and then calculate the square root of the time. For example, the first time step is 1 day, first converted to 86400 seconds, and then the square root of the time in seconds is calculated as 294s^0.5; then obtaining the corresponding oil production amount for the first time step, and convert the corresponding oil production amount into cm³/s, and taking the reciprocal of the oil production amount again. Getting the square root of time corresponding to multiple time steps as the abscissa (the unit is s^0.5), and the points with the reciprocal of the oil production corresponding to the time step as the ordinate (the unit is s/cm³), according to the above points, a straight line is fitted, and the slope m of the straight line is calculated.

Then, calculate the fracture half length of the fracturing points using the following equation (2)

$$X_{i1} = 31.3 \frac{1}{\sqrt{k_{i1}}} \frac{B}{m_{i1} h_{i1} \Delta p_{i1}} \sqrt{\frac{\mu}{\phi_{i1} C_t}} \quad (2)$$

In the above equation (2), $X_{i1}$ is the corresponding half length of fracture of the $i1^{th}$ fracturing point, $i1=1, 2 \ldots n1$, $n1$ is the number of fracturing points of the fractured horizontal well; $k_{i1}$, $\phi_{i1}$, $h_{i1}$ are the permeability, the porosity and the oil reservoir thickness of the reservoir corresponding to the $i1^{th}$ fracturing point respectively; $\Delta pi1$ is the difference between the bottom hole pressure of the fractured horizontal well and the reservoir pressure corresponding to the $i1^{th}$ fracturing point; $m_{i1}$ is the slope corresponding to the $i1^{th}$ fracturing point; B is the crude oil volume coefficient of the target well section; $\mu$ is the crude oil viscosity of the target well section; $C_t$ is the rock comprehensive compression coefficient of the target well section.

The above crude oil volume coefficient, crude oil viscosity and comprehensive compression coefficient can be measured by high pressure experiments. The permeability, porosity and oil reservoir thickness of the corresponding reservoir at each design fracturing point can be obtained according to the results of logging and earthquake interpretation.

Step S22: calculating the fracture conductivity value of each fracturing point according to the fracturing potential value and the fracture half length of each fracturing point of the fractured horizontal well.

The method for calculating fracture conductivity values of each fracturing point of a fractured horizontal well will be described in details later.

Step S23: training and learning are carried out based on the fracture conductivity value and the fracturing potential value of each fracturing point of the plurality of fractured horizontal wells, to obtain the first corresponding relation between the fracture conductivity value and the fracturing potential value:

Wherein, the first corresponding relation refers to the corresponding relation between the final learning value of the fracture conductivity and the fracturing potential value.

Specifically, training and learning are carried out based on the fracture conductivity value and the fracturing potential value of each fracturing point of the plurality of fractured horizontal wells, and the following learning results are obtained for multiple times:

$$CD_{i2}^{i3} = \theta_0 + \theta_{i3} FP_{i2} \quad (3)$$

In the above equation (3), $CD_{i2}^{i3}$ is the $i3^{th}$ learning value of the fracture conductivity corresponding to the $i2^{th}$ fracturing point, $i3=1, 2 \ldots, i2=1, 2 \ldots n3$, $n3$ is the number of fracturing points of the plurality of fractured horizontal wells and $n3 \geq n1$; $\theta_0$ is a constant, $\theta_{i3}$ is the equation coefficients required to be determined for the $i3^{th}$ learning; $FP_{i2}$ is the fracturing potential value of the $i2^{th}$ fracturing point;

The equation coefficient $\theta_{i3}$ to be determined for the $i3^{th}$ learning is obtained by the following equation:

$$\theta_{(i3)+1} = \theta_{i3} - \alpha \frac{\partial J(\theta_{i3})}{\partial \theta_{i3}} \quad (4)$$

In the above equation (4), $\theta_1 = \theta_{00}$, $\theta_{00}$ is a constant, represents the initial equation coefficient; $J(\theta_{i3})$ is the loss function of the $i3^{th}$ learning, and the loss function is specifically calculated by the following equation:

$$J(\theta_{i3}) = \frac{1}{2} \sum_{i2=1}^{n3} (CD_{i2}^{i3} - CD_{i2})^2 \quad (5)$$

In the above equation (5), $CD_{i2}$ represents the fracture conductivity value of the $i2^{th}$ fracturing point;

And when minimum value is determined by the loss function, the corresponding learning result is the corresponding relation between the fracture conductivity and the fracturing potential value.

Step S24: training and learning are carried out based on the fracture half length and the fracturing potential value of each fracturing point of a plurality of fractured horizontal wells, to obtain a second corresponding relation between the fracture half length and the fracturing potential value.

Wherein the second corresponding relation refers to the corresponding relation between the final learning value of the fracture half length and the fracturing potential value.

The specific learning process is similar to step S23, and it can be, training and learning are carried out based on the fracture half length and the fracturing potential value of each fracturing point of the fractured horizontal well, and the following learning results are obtained for multiple times:

$$X_{i5}^{i4} = \beta_0 + \beta_{i4} FP_{i5} \quad (6)$$

In the above equation (6), $X_{i5}^{i4}$ is the $i4^{th}$ learning value of fracture half length corresponding to the $i5^{th}$ fracturing points, $i4=1, 2 \ldots, i5=1, 2 \ldots n4$, $n4$ is the number of the fracturing points for learning, and $n4 \geq n1$; $\beta_0$ is a constant; $\beta_{i4}$ is the equation coefficient to be determined for the $i4^{th}$ learning; $FP_{i5}$ represents the fracturing potential value at the $i5^{th}$ fracturing point;

The equation coefficient $\beta_{i4}$ to be determined for the $i4^{th}$ learning is obtained by the following equation (7):

$$\beta_{(i4)+1} = \beta_{i4} - \alpha \frac{\partial J(\beta_{i4})}{\partial \beta_{i4}} \quad (7)$$

In the above equation (7), $\beta_1 = \beta_{00}$, $\beta_{00}$ is a constant, representing initial equation coefficient; $J(\beta_{i4})$ is the loss function of $i4^{th}$ learning, the loss function is obtained by the following equation (8):

$$J(\beta_{i4}) = \frac{1}{2} \sum_{i5=1}^{n4} (X_{i5}^{i4} - X_{i5})^2 \quad (8)$$

In the above equation (8), $X_{i5}$ is the fracture half length at the i5$^{th}$ fracturing points;

When the minimum value is obtained by the loss function, the corresponding learning result is the corresponding relation between the fracture half length and the fracturing potential value.

The above step S23 may be executed before step S22, after step S24, or simultaneously with step S22 and/or step S24, as long as it is executed after step S21.

Figure 4:
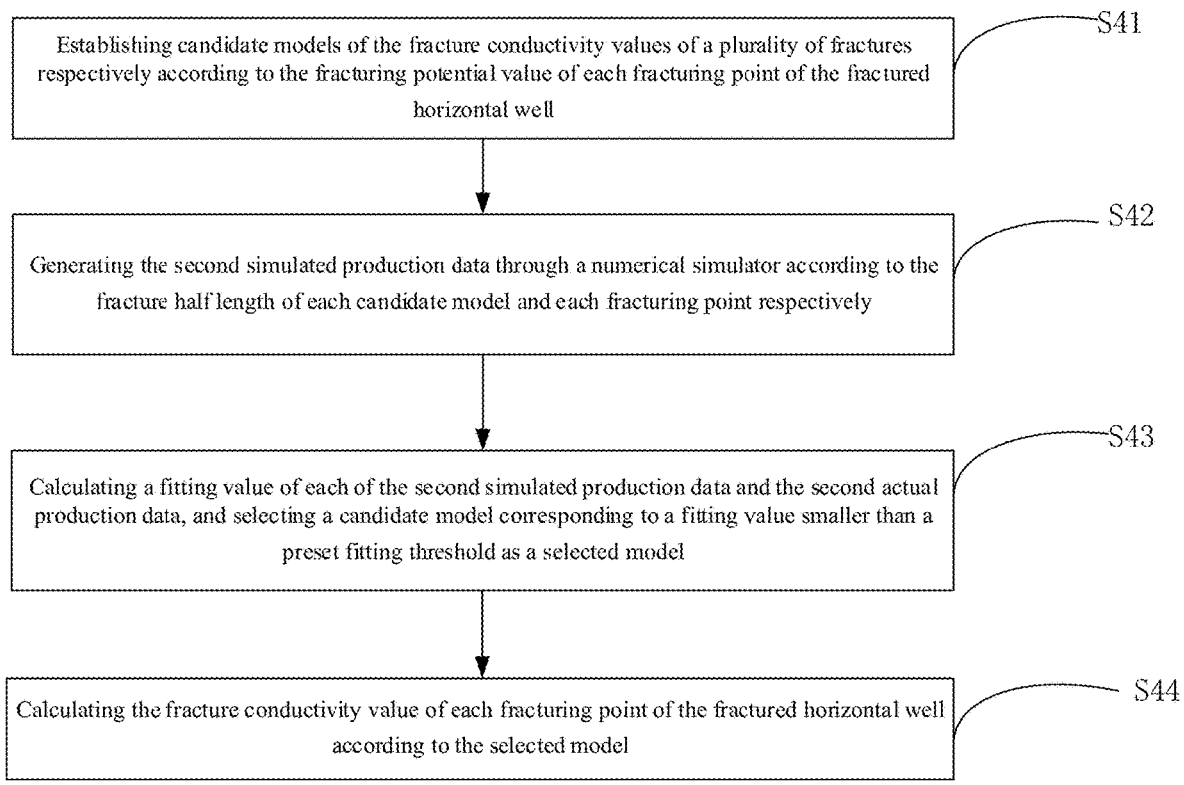
FIG. 4 is a flowchart of the realization of the calculation method of the fracture conductivity value of each fracturing point of fractured horizontal well in step S22 of the embodiment 2 of the present invention.

The calculation of the fracture conductivity value of each fracturing point of the fractured horizontal well in the step S22 is shown in FIG. 4, and the specific steps are as follows:

Step S41: establishing candidate models of the fracture conductivity values of a plurality of fractures respectively according to the fracturing potential value of each fracturing point of the fractured horizontal well.

The candidate models refer to a plurality of candidate models. The candidate models of the fracture conductivity value represent the corresponding relation between the fracture conductivity candidate value and the fracturing potential value at each fracturing point of the fractured horizontal well.

The fracturing potential value is closely related to the fracturing effect, the region with high fracturing potential value has better fracturing effect, and the fracture formed has strong fracture conductivity; on the contrary, the region with relatively low fracturing potential value has worse fracturing effect, and the fracture formed has weak fracture conductivity. Therefore, the fracture conductivity value and the fracturing potential value have correlation, but not in a strict linear relation. The embodiment 2 is a simplified candidate model, and the linear relation is assumed to be between the two.

A plurality of candidate fracture conductivity models of the fractured horizontal well are established as follows:

$$CD_{i1}^m = \left( \frac{CD_{max} - CD_{min}}{FP_{max} - FP_{min}} (FP_{i1} - FP_c) + CD_c \right) \quad (9)$$

$$\left( 1 + (-1)^{m-1} \frac{round(\frac{m-1}{2})}{10} \right)(FP_{i1} > FP)$$

In the above equation (9), wherein, $CD_{i1}^m$ is the candidate value of fracture conductivity of the i1$^{th}$ fracturing points of the m$^{th}$ candidate model of the fractured horizontal well, m represents the serial number of the candidate model, m=1, 2 . . . , i1=1, 2 . . . n1, n1 represents the number of fracturing points of the fractured horizontal well; $CD_{max}$ and $CD_{min}$ represent the maximum value and the minimum value respectively of first calculation of the fracture conductivity value of all the fracturing points of the fractured horizontal well, and it may be calculated using fracturing design software; $FP_{max}$ and $FP_{min}$ represent the maximum value and the minimum value of fracturing potential value of all fracturing points of the fractured horizontal well; $FP_{i1}$ is the fracturing potential value of the i1$^{th}$ fracturing points of the fractured horizontal well; $FP_c$ is the fracturing potential threshold of fractured horizontal well in reservoir, and representing the lower limit of the fracturing potential value selected at the fracturing position, and when the fracturing potential value is less than the lower limit, fracturing cannot generate fractures of required scale or even cannot initiate, so that the fracturing position is not considered; the fracturing points mentioned above are fracturing points which successfully generate fractures of a certain scale, so that the fracturing potential values of all the fracturing points are greater than a fracturing potential threshold value; $CD_c$ is the predicted value of the base fracture conductivity, and the value can be obtained by empirical fracture conductivity of the reservoir matrix.

Specifically, the fracture conductivity value primarily calculated by using the fracturing design software may be: obtaining the permeability of each fracturing point through the physical property data of the reservoir; referring to the amount of fracturing fluid and construction parameters during the fracturing construction of each fracturing point of the fractured horizontal well, primarily calculating the width of the fracture through fracturing design software, calculating a dimensionless value, namely a standard value, of the permeability and the width of the fracture corresponding to each fracturing point, and taking the product of the permeability standard value and the fracture width standard value as the fracture conductivity value of each fracturing point. The fracture conductivity value calculated by the method is only used as an intermediate parameter in this step instead of the final result of the fracture conductivity value due to uncertain factors and larger errors.

Step S42: generating the second simulated production data through a numerical simulator according to the fracture half length of each candidate model and each fracturing point respectively.

Wherein the second simulated production data comprises simulated oil production at each time step for a target well section of the fractured horizontal well. For example, in equation (9) of step S41, each candidate model in which m is increased from 1 sequentially: obtaining second simulated production data corresponding to each candidate fracture conductivity model through a numerical simulator based on the candidate model and the fracture half length of each fracturing point, namely the simulated oil production in each time step in sequence after fracturing production, alternatively, the time step can be one day, one week, ten days or one month, as long as the actual oil production in the corresponding time step can be obtained. Preferably, the time step may be the shortest time step capable of obtaining the actual oil production amount of the corresponding time step, so that the accuracy is higher when the variance between the two simulated production data and the two actual production data is calculated, but the calculated data amount is also the largest. Therefore, it is preferable that the length of the time step be set in consideration of both the accuracy and the amount of calculation.

Step S43 calculating a fitting value of each of the second simulated production data and the second actual production data, and selecting a candidate model corresponding to a fitting value smaller than a preset fitting threshold as a selected model.

The selected model is a candidate model which is selected from a plurality of candidate models and used for calculating the fracture conductivity value of each fracturing point. In fact, there may be more than one candidate models less than the preset fitting threshold, and the first candidate model fitting the condition can be selected as the selected model.

Wherein, calculating a variance of the corresponding second simulated production data and second actual production data using the following equation (10):

$$\sigma_m = \sum_{j1=1}^{n2} (Q_{m,j1} - Q_{real,j1})^2 \quad (10)$$

In the above equation (10), $\sigma_m$ is the variance of the second simulated production data and the second actual production data corresponding to the $m^{th}$ candidate model; j1 is the $j1^{th}$ time step, j1=1, 2 ... n2, n2 is the total number of time steps; $Q_{m,j1}$ is the simulated oil production at the $j1^{th}$ time step in the second simulated production data; $Q_{real,j1}$ is the actual oil production at the $j1^{th}$ time step in the second actual production data.

Step S44: calculating the fracture conductivity value of each fracturing point of the fractured horizontal well according to the selected model.

After a selected model of the fractured horizontal well is obtained, calculating fracture conductivity values of all fracturing points of the fractured horizontal well according to the selected model Calculating the fracture conductivity value of each fracturing point of each fractured horizontal well in the reservoir according to the method of the steps S41-S44.

The above calculation of the fracture conductivity value of the fractured horizontal well is calculated by a selected model of which the fitting value of the second simulated production data and the second actual production data is less than a preset fitting threshold value, so that the accuracy of the calculated fracture conductivity value is high; therefore, the corresponding relation between the fracture conductivity value and the fracturing potential value is obtained through learning, and the finally calculated fracture conductivity value of each data point of the horizontal well to be fractured is high in accuracy and high in rationality, and an effective data base is provided for fracturing design of the horizontal well to be fractured.

Embodiment 3

Figure 5:
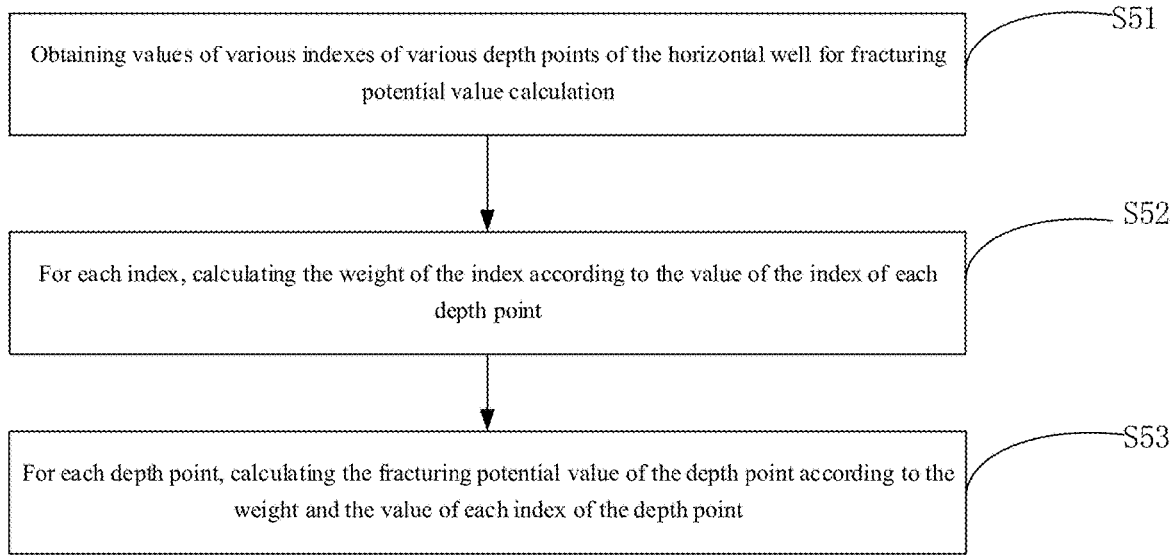
FIG. 5 is a flowchart of calculation method of the horizontal well fracturing potential value of the embodiment 3 of the present invention.

The method for calculating the fracturing potential value of the horizontal well provided by the embodiment 3 of the present invention has the workflow shown in FIG. 5 and comprises the following steps:

Step S51: obtaining values of various indexes of various depth points of the horizontal well for fracturing potential value calculation.

For the fractured horizontal well, the depth points comprise all the fracturing points of the fractured horizontal well; for the horizontal well to be fractured, the depth points comprise all designed fracturing points of the horizontal well to be fractured.

In an embodiment, values of indexes of at least two depth points of the horizontal well are obtained; wherein the indexes comprise at least one index of each of rock mechanical characteristic indexes and petrophysical parameter indexes; rock mechanics characteristic index at least comprising: Lame constant, strain energy release rate, brittleness index and fracture toughness; the petrophysical parameter indexes at least comprise: oil saturation, permeability, porosity.

Because the fracturing potential of the reservoir is influenced by multiple common factors such as rock mechanical characteristics, petrophysical parameters and so on, all the acquired factors influencing the fracturing potential are considered as much as possible in the selection of indexes.

In an embodiment, after receiving data of at least one index of at least one depth point, the data is subjected to validity identification to obtain valid data.

For each value, the effectiveness identification of the index effectiveness and the value effectiveness are carried out at the same time; or, after all the data are received, the effective indexes are screened firstly, and then the effective values of all the depth points are screened according to all the indexes.

The validity identification of the index and the value may specifically be: screening effective indexes of each depth point according to a pre-stored index list, and screening effective values of the effective indexes according to effective information in the index list to obtain effective data. The index list comprises effective information of effective index.

The valid information may include at least one of the following information of the index: index number, index name, index type, positive and negative indexes and effective numerical range of the indexes. The index list contains all possible indexes.

The positive direction and the negative direction of the indexes represent the influencing trend of the indexes, and the influencing trend of the indexes on the fracturing potential of the horizontal well can be judged by each index; and determining the index to be positive or negative according to the influencing trend: the fracturing potential of the horizontal well is increased along with the increase of the index value, and the index is positive; the fracturing potential of the horizontal well is increased along with the reduction of the index value, and the index is negative. For example, the Lame constant is the lateral tensile stress required to be applied for preventing the transverse strain of the rock and maintaining the one-dimensional strain, the smaller the Lame constant of the horizontal well is, the easier the fracture is to open the fracture, the harder the fracture is to close, and the greater the fracturing potential of the horizontal well is, so the Lame constant is a negative index; for example, fracture toughness describing the capability of a rock for preventing fracture propagation, the smaller the fracture toughness of a horizontal well is, the easier the fracture is to extend, the more favorable hydraulic fracturing is, the greater the fracturing potential of the horizontal well is, and therefore the fracture toughness is a negative index; for example, the strain energy release rate is the energy consumption per unit area in the process of generating a new fracture, the fracture propagation capacity is represented, the larger the strain energy release rate of the horizontal well is, the stronger the crack propagation capacity is, the larger the fracturing potential of the horizontal well is, and therefore, the strain energy release rate is a positive index.

The range of the index effective value, that is, the maximum value and the minimum value of the index value, may be limited to both the maximum value and the minimum value, may be limited to only one of the maximum value and the minimum value, or may be unlimited to both of the maximum value and the minimum value, depending on the actual situation. As shown in Table 2, is an illustration of a list of indexes.

TABLE 2

| Index List | | | | | | |
|---|---|---|---|---|---|---|
| | | | | | Index Effective Value Range | |
| Index Number | Index Name | Index Type | Index Direction | Index Unit | Min Value | Max Value |
| Index 1 | Reservoir Porosity | Physical | Positive(+) | % | >0 | 100 |
| Index 2 | Reservoir Permeability | Physical | Positive(+) | mD | >0 | — |

TABLE 2-continued

Index List

| Index Number | Index Name | Index Type | Index Direction | Index Unit | Index Effective Value Range Min Value | Index Effective Value Range Max Value |
|---|---|---|---|---|---|---|
| Index 3 | Oil Saturation | Physical | Positive(+) | % | >0 | 100 |
| Index 4 | Lame Constant | Mechanics | Negative(−) | GPa | >0 | 50 |
| Index 5 | Strain Energy | Mechanics | Positive(+) | GPa | >0 | 80 |
| Index 6 | Brittleness | Mechanics | Positive(+) | Dimensionless | >0 | 1 |
| Index 7 | Fracture Toughness | Mechanics | Negative(−) | MPa | >0 | 8 |

In the index list shown in table 2, the unit of each index may be other units as long as the units of all indexes are associated with each other. The unit of the value of each index in the acquired effective data may be the same as or different from that in the index list. When the data are inconsistent, the acquired data are subjected to unit conversion according to units in the index list, and then effectiveness identification can be carried out.

In the validity identification process, if the received data contains the indexes which are not contained in the pre-stored index list or the values of the indexes are not in the valid value range, an error report is sent, whether the original data needs to be sent again is prompted, and if a yes command is received, new data is waited to be received again; if no command is received, only the indexes contained in the index list are screened, and the index values with the values in the effective range are obtained to obtain effective data.

The obtained effective data comprises values of indexes of a plurality of depth points.

In an embodiment, a matrix model is obtained that comprises each index value for each depth point:

$$X = (x_{a,b})_{s,r} = \begin{bmatrix} x_{11}, x_{12}, \ldots, x_{1r} \\ x_{21}, x_{22}, \ldots, x_{2r} \\ \ldots \\ x_{s1}, x_{s2}, \ldots, x_{sr} \end{bmatrix}$$

Wherein, $x_{a,b}$ is the value of the index of the $a^{th}$ item of the $b^{th}$ depth point, b=1, 2 . . . r, r is the number of depth points, a=1, 2 . . . s, s is the number of all indexes, r and s are positive integers.

Step S52: for each index, calculating the weight of the index according to the value of the index of each depth point.

In an embodiment, after obtaining the values of each index of each depth point of the fractured horizontal well or the horizontal well to be fractured for calculating the fracturing potential value, the standard values of each index of each depth point are calculated, and the specific calculation method is described in detail later.

In an embodiment, the information entropy of each index is calculated according to the value of each index of each depth point; and calculating the entropy weight of each index as weight according to the information entropy of each index.

In an embodiment, the index weight can be determined by using an entropy weight method, and the information entropy $E_a$ of each index is calculated according to the standard value of each index of each depth point:

$$E_a = -\ln(r)^{-1} \sum_{b=1}^{r} p_{a,b} \ln p_{a,b} \qquad (11)$$

In the above equation (11), $E_a$ is the information entropy of the index of the $a^{th}$ item;

$$p_{a,b} = y_{a,b} \bigg/ \sum_{b=1}^{r} y_{a,b},$$

if $p_{a,b}=0$, then define $p_{a,b} \ln p_{a,b}=0$; $y_{a,b}$ is the standard value of the $a^{th}$ index of the $b^{th}$ depth point.

And then calculating the weight $W_a$ of each index according to the information entropy of each index:

$$W_a = \frac{1 - E_a}{s - \sum_{a=1}^{s} E_a} \qquad (12)$$

In the above equation (12), $W_a$ is the weight of the index of the $a^{th}$ item, $0 \leq W_a \leq 1$, and $$\sum_{a=1}^{s} W_a = 1.$$

Step S53: for each depth point, calculating the fracturing potential value of the depth point according to the weight and the value of each index of the depth point.

Based on the weight of each index calculated in step S52, the fracturing potential value $FP_b$ of each depth point is calculated using the following equation:

$$FP_b = \frac{\sum_{a1=1}^{s1} W_{a1}\left(\frac{P_{a1,b} - P_{min}^{a1}}{P_{max}^{a1} - P_{min}^{a1}}\right) + \sum_{a2=1}^{s2} W_{a2}\left(\frac{N_{a2,b} - N_{max}^{a2}}{N_{min}^{a2} - N_{max}^{a2}}\right)}{\sum_{a=1}^{s} W_a} \qquad (13)$$

In the above equation (13), $FP_b$ represents the value of the fracturing potential at the $b^{th}$ depth point; $P_{a1,b}$ is the standard value of the positive index of the item $a1^{th}$ at the $b^{th}$ depth point, $P_{a1,b}=y_{a1,b}$, $N_{a2,b}$ represents the standard value of the negative index of the $a2^{th}$ item at the $b^{th}$ depth point, $N_{a2,b}=y_{a2,b}$, a1=1, 2 . . . s1, s1 is the number of items of the positive index, a2=1, 2 . . . s2, s2 is the number of items of the negative index, s1+s2=s; the subscripts max and min represent the maximum and minimum values of the standard values of the respective indexes for all depth points respectively.

The values of all indexes of all depth points of the horizontal well for calculating the fracturing potential are obtained, including all indexes influencing the fracturing potential, and therefore all influencing factors can be comprehensively analyzed; for each index, calculating the weight of the index according to the value of the index of each depth point; further, for each depth point, calculating the fracturing potential value of the depth point according to the weight and the value of each index of the depth point, so that the calculated fracturing potential value of each depth point is a result of the joint influence of each index; therefore, the calculation result of the final fracturing potential value has higher reasonability, accuracy and practicability. Furthermore, the fracture conductivity calculated by taking the fracturing potential value as basic data has higher accuracy and practicability, and can better guide development.

Figure 6:
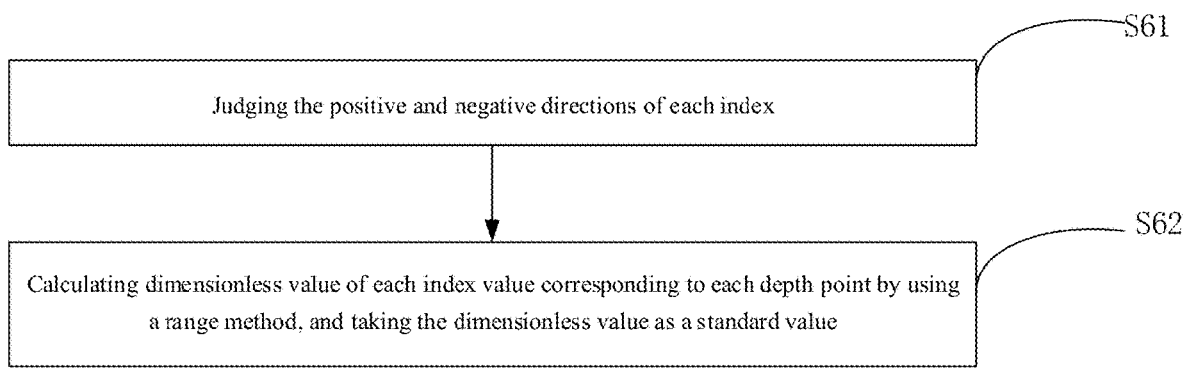
FIG. 6 is a flowchart of the realization of the calculation of the numerical standard value used in step S52 of the embodiment 3 of the present invention.

Specifically, in step S52, the standard value of the index value corresponding to each depth point is calculated, and a specific calculation method may include the following steps as shown in FIG. 6:

Step S61: judging the positive and negative directions of each index.

In an embodiment, the influencing trend of each index on the fracturing potential of a fractured horizontal well or a horizontal well to be fractured is judged; determining whether the index is positive or negative according to the influencing trend.

As a specific implementation of this embodiment, according to the matching relationship between the index number, the index name and the positive and negative directions of the index included in the effective information of each index in the index list stored in advance, the positive and negative directions of the index are determined according to the index number or name.

Step S62: calculating dimensionless value of each index value corresponding to each depth point by using a range method, and taking the dimensionless value as a standard value.

In an embodiment, the standard value of each index may be calculated according to the positive and negative directions of each index and the value of each index by using the following equation:

$$\begin{cases} y_{a,b} = \frac{x_{a,b} - \min(X_a)}{\max(X_a) - \min(X_a)} \text{(Index is positive)} \\ y_{a,b} = \frac{\max(X_a) - x_{a,b}}{\max(X_a) - \min(X_a)} \text{(Index is negative)} \end{cases} \quad (14)$$

In the above equation (14), $\max(X_a)$ and $\min(X_a)$ represent maximum and minimum values of the index values of the $a^{th}$ item corresponding to all depth points respectively.

After the effective data are obtained, the positive and negative directions of all indexes are analyzed, and then the values are subjected to dimensionless standardization, so that the calculation result of the fracturing potential is not influenced by different values due to different index units.

Figure 7:
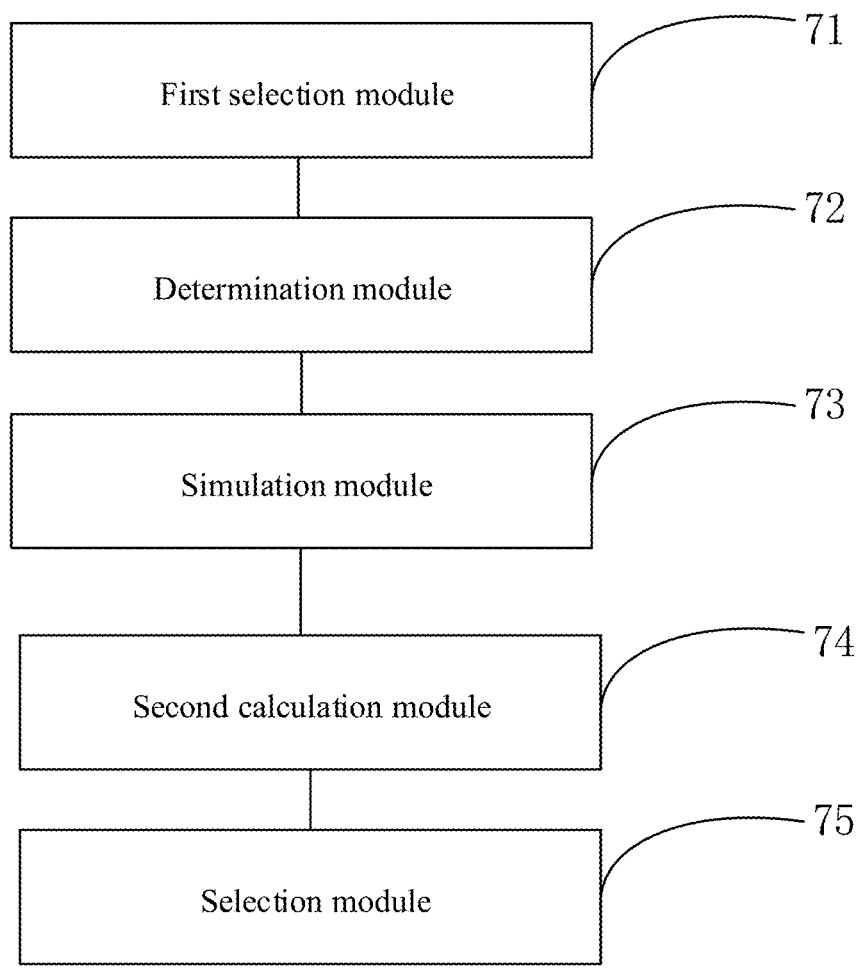
FIG. 7 is a structural diagram of the fracturing design device for the horizontal well to be fractured based on the fracturing potential in the embodiment of the present invention.

Based on the same inventive concept, the embodiment of the present invention also provides a fracturing design device of a horizontal well to be fractured based on the fracturing potential. As shown in FIG. 7, the structure of the device is comprises the following modules:

A first calculation module 71 is used for the horizontal well to be fractured or each fractured horizontal well which is positioned in the same reservoir with the horizontal well to be fractured: obtaining the value of each index of each depth point for calculating the fracturing potential value; calculating the fracturing potential value of each depth point by using the value of each index of each depth point to obtain the designed fracturing point or the fracturing potential value of each fracturing point.

A determination module 72 is used for determining the first corresponding relation between the fracture conductivity value and the fracturing potential value and the second corresponding relation between the fracture half length and the fracturing potential value based on the fracturing potential value and the first actual production data of each fracturing point of each fractured horizontal well calculated by the first calculation module 71. The first actual production data comprises the oil production of the fracturing point at each time step.

A simulation module 73 is used for calculating the fracture conductivity value and the fracture half length of the designed fracturing points according to the first corresponding relation and the second corresponding relation determined by the determination module 72 and the fracturing potential value of each designed fracturing points calculated by the first calculation module 71 for each candidate design of the multiple designed fracturing points of the horizontal well to be fractured, and generating first simulated production data corresponding to the candidate design through a numerical simulator. The first simulated production data comprise simulated oil production and simulated water production of each time step corresponding to the candidate design.

A second calculation module 74 is used for calculating a predicted net present value corresponding to the candidate design according to the first simulated production data corresponding to the candidate design obtained by the simulation module 73 and the fracture half length at each design fracturing point.

A selection module 75 is used for calculating the candidate design with the highest predicted net present value calculated by the second calculation module 74 as the fracturing position design scheme of the horizontal well to be fractured.

In an embodiment, the first calculation module 71 is specifically used for:

for each index, calculating the weight of the index according to the value of the index of each depth point; and for each depth point, calculating the fracturing potential value of the depth point according to the weight and the value of each index of the depth point.

In an embodiment, the determination module 72 is specifically used for:

for each fractured horizontal well, calculating the fracture half length of each fracturing point according to first actual production data of each fracturing point of the fractured horizontal well; calculating the fracture conductivity value of each fracturing point according to the fracturing potential value and the fracture half length of each fracturing point of the fractured horizontal well; and training and learning based on fracture conductivity values and fracturing potential values of each fracturing point of a plurality of fractured horizontal wells to obtain a first corresponding relation between the fracture conductivity values and the fracturing potential values; and training and learning based on the fracture half length and the fracturing potential value of each fracturing point of the plurality of fractured horizontal wells to obtain a second corresponding relation between the fracture half length and the fracturing potential value.

In an embodiment, the determination module 72 is specifically used for:

establishing a plurality of candidate models of the fracture conductivity values respectively according to the fracturing potential value of each fracturing point of the fractured horizontal well;

generating second simulated production data through a numerical simulator according to the fracture half length of each candidate model and each fracturing point respectively, in which the second simulated production data comprises simulated oil production at each time step of the target well section of the fractured horizontal well;

calculating the fitting value of each second simulated production data and second actual production data, and selecting a candidate model corresponding to the fitting value less than a preset fitting threshold value as a selected model; and calculating the fracture conductivity value of each fracturing point of the fractured horizontal well according to the selected model.

In an embodiment, the second calculation module 74 is specifically used for:

calculating a predicted net present value for the candidate design using the equation:

$$NPV = \sum_{j2=1}^{n5} \left( \frac{(Q_o^{j2} r_g - Q_w^{j2} r_w) \Delta t_{j2}}{(1+b)^{\frac{t_{j2}}{365}}} \right) - \sum_{i6=1}^{n6} 2 X_{i6} C$$

wherein, NPV is the predicted net present value corresponding to candidate design; j2 is the $j2^{th}$ time step of the first simulated production data, j2=1, 2 ... n5, n5 is number of time steps in first simulated production data; $r_g$ and $r_w$ are the price of oil per unit volume and the price of water per unit volume to be treated respectively; $t_{j2}$ is the time point corresponding to the $j2^{th}$ time step; $\Delta t_{j2}$ is the length of the time step; b is the discount rate; C is the fracturing cost of per unit fracturing length; $Q_o^{j2}$ and $Q_w^{j2}$ are the simulated oil production and the simulated water production at the $j2^{th}$ time step in the first simulated production data respectively; $X_{i6}$ is the fracture half length of the $i6^{th}$ design fracturing point, i6=1, 2 ... n6, n6 is the number of design fracturing points corresponding to the candidate design.

With regard to the device in the embodiment described above, the specific manner in which each module performs the operation has been described in detail in the embodiment related to the method, and will not be described in detail here.

Based on the same inventive concept, embodiments of the present invention provide a computer-readable storage medium, on which computer instructions are stored, and when the instructions are executed by a processor, the fracturing design method for a horizontal well to be fractured based on fracturing potential is implemented.

Unless specifically stated, terms such as processing, computing, calculating, determining, displaying, or the like, may refer to an action and/or process of one or more processing or computing systems or similar devices that manipulates and transforms data represented as physical (e.g., electronic) quantities within the processing system's registers and memories into other data similarly represented as physical quantities within the processing system's memories, registers or other such information storage, transmission or display devices. Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

It should be understood that the specific order or hierarchy of steps in the processes disclosed is an example of exemplary approaches. Based upon design preferences, it is understood that the specific order or hierarchy of steps in the processes may be rearranged without departing from the scope of the present disclosure. The accompanying method claims present elements of the various steps in a sample order, and are not intended to be limited to the specific order or hierarchy presented.

In the foregoing detailed description, various features are grouped together in a single embodiment for the purpose of streamlining the disclosure. This method of disclosure is not to be interpreted as reflecting an intention that the claimed embodiments of the subject matter require more features than are expressly recited in each claim. Rather, as the following claims reflect, invention lies in less than all features of a single disclosed embodiment. Thus, the following claims are hereby expressly incorporated into the detailed description, with each claim standing on its own as a separate preferred embodiment of the present invention.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

For a software implementation, the techniques described herein may be implemented with modules (e.g., procedures, functions, and so on) that perform the functions described herein. The software codes may be stored in memory units and executed by processors. The memory unit may be implemented within the processor or external to the processor, in which case it can be communicatively coupled to the processor via various means as is known in the art.

What has been described above comprises examples of one or more embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the embodiments described herein are intended to embrace all such alterations, modifications and variations that fall within the scope of the appended claims. Furthermore, to the extent that the term "comprises" is used in either the detailed description or the claims, such term is intended to be inclusive in a manner similar to the term "comprising" as "comprising" is interpreted when employed as a transitional word in a claim. Furthermore, any use of the term "or" in the specification of the claims is intended to mean "non-exclusive or".

What is claimed is:
1. A method for generating candidate designs and selecting a fracturing position design scheme from the candidate designs of a horizontal well to be fractured based on fracturing potential, said method comprising:
   for the horizontal well to be fractured or each fractured horizontal well which is positioned in the same reservoir layer with the horizontal well to be fractured:
   obtaining a value of each index of each depth point for calculating a fracturing potential value;
   calculating the fracturing potential value of each depth point by using the value of each index of each depth point to obtain a designed fracturing point or the fracturing potential value of each fracturing point;
   determining a first corresponding relation between a fracture conductivity value and the fracturing potential value and a second corresponding relation between a fracture half length and the fracturing potential value based on the fracturing potential value of each fracturing point of each fractured horizontal well and a first actual production data, in which the first actual production data comprises the oil production of the fracturing point at each time step;
   calculating the fracture conductivity value and the fracture half length of the designed fracturing points according to the first corresponding relation, the second corresponding relation and the fracturing potential value of each designed fracturing point for each of the candidate designs of a plurality designed fracturing points of the horizontal well to be fractured, and generating first simulated production data corresponding to each of the candidate designs through a numerical simulator, in which the first simulated production data comprise simulated oil production and simulated water production of each time step corresponding to the candidate designs;
   calculating a predicted net present value corresponding to each of the candidate designs according to the first simulated production data corresponding to the candidate designs obtained by a simulated module and the fracture half length at each design fracturing point;
   determining which of the candidate designs has the highest predicted net present value calculated by a second calculation module; and
   selecting the candidate design with the highest predicted net present value calculated by the second calculation module as the fracturing position design scheme of the horizontal well to be fractured.

2. The method of claim 1, wherein the step of calculating the fracturing potential value of each depth point by using the value of each index of each depth point comprises:
   calculating a weight of each index according to the value of the index of each depth point; and
   for each depth point, calculating the fracturing potential value of the depth point according to the weight of each index of the depth point and the value of each index.

3. The method of claim 1, wherein the step of determining a first corresponding relation between a fracture conductivity value and the fracturing potential value and a second corresponding relation between a fracture half length and the fracturing potential value based on the fracturing potential value of each fracturing point of each fractured horizontal well and a first actual production data, comprises:
   calculating the fracture half length of the fracturing points according to the first actual production data of each fracturing point of the fractured horizontal well for each of the fractured horizontal wells; and calculating the fracture conductivity value of each fracturing point according to the fracturing potential value and the fracture half length of each fracturing point of the fractured horizontal well; and
   training and learning based on the fracture conductivity value and the fracturing potential value of each fracturing point of a plurality of fractured horizontal wells to obtain the first corresponding relation between the fracture conductivity value and the fracturing potential value; training and learning based on the fracture half length and the fracturing potential value of each fracturing point of a plurality of fractured horizontal wells to obtain the second corresponding relation between the fracture half length and the fracturing potential value.

4. The method of claim 3, wherein the step of calculating the fracture half length of the fracturing points comprises:
   fitting each of the square root of the time corresponding to each time step in the first actual production data as an abscissa and the reciprocal of the oil production corresponding to the time step as an ordinate to obtain a fitting curve, calculating the slope m of the fitting curve; and
   calculating the fracture half length of the fracturing points using the following equation:

$$X_{i1} = 31.3 \frac{1}{\sqrt{k_{i1}}} \frac{B}{m_{i1} h_{i1} \Delta p_{i1}} \sqrt{\frac{\mu}{\phi_{i1} C_t}}$$

wherein, $X_{i1}$ is the fracture half length of corresponding the $i1^{th}$ fracturing point, $i1=1, 2 \ldots n1$, n1 is the number of fracturing points of the fractured horizontal well; $k_{i1}, \phi_{i1}, h_{i1}$ are the permeability, the porosity and the oil reservoir thickness of the reservoir corresponding to the $i1^{th}$ fracturing point respectively, $\Delta pi1$ is the difference between the bottom hole pressure of the fractured horizontal well and the reservoir pressure corresponding to the $i1^{th}$ fracturing point; $m_{i1}$ is the slope corresponding to the $i1^{th}$ fracturing point; B is the crude oil volume coefficient of the target well section; μ is the crude oil viscosity of the target well section; $C_t$ is the rock comprehensive compression coefficient of the target well section.

5. The method of claim 3, wherein the step of calculating the fracture conductivity value of each fracturing point according to the fracturing potential value and the fracture half length of each fracturing point of the fractured horizontal well, comprises:
   establishing a plurality of candidate models of fracture conductivity values respectively according to the fracturing potential values of each fracturing point of the fractured horizontal well;
   generating second simulated production data through a numerical simulator according to the fracture half length of each of the candidate models and each fracturing point, in which the second simulated production data comprises simulated oil production of the target well section of the fractured horizontal well at each time step;
   calculating each of the fitting value of the second simulated production data and the second actual production data, and selecting the candidate model corresponding to the fitting value smaller than the preset fitting threshold as a selected model, in which the second actual production data comprises oil production at each time step of the target well section of the fractured horizontal well; and calculating the fracture conductivity value of each fracturing point of the fractured horizontal well according to the selected model.

6. The method of claim 1, wherein the step of calculating a predicted net present value corresponding to each of the candidate designs, comprises:

calculating the predicted net present value corresponding to each of the candidate designs by using the following equation:

$$NPV = \sum_{j2=1}^{n5} \left( \frac{(Q_o^{j2} r_g - Q_w^{j2} r_w) \Delta t_{j2}}{(1+b)^{\frac{t_{j2}}{365}}} \right) - \sum_{i6=1}^{n6} 2X_{i6} C$$

wherein, NPV is the predicted net present value corresponding to the candidate design, j2 is the j2$^{th}$ time step of the first simulated production data, j2=1, 2 ... n5, n5 is the number of time steps in the first simulated production data; $r_g$ and $r_w$ represent the price of oil per unit volume and the price of water per unit volume to be treated respectively; $t_{j2}$ is the time point corresponding to the j2$^{th}$ time step; $\Delta t_{j2}$ is the time step length; b is the discount rate; C is the fracturing cost per unit fracture length; $Q_o^{j2}$ and $Q_w^{j2}$ represent the simulated oil production and the simulated water production of the j2$^{th}$ time step in the first simulated production data respectively; $X_{i6}$ is the fracture half length of the i6$^{th}$ design fracturing point, i6=1, 2 ... n6, n6 is the number of design fracturing points corresponding to the candidate design.

7. A system for generating candidate designs and selecting a fracturing position design scheme from the candidate designs of a horizontal well to be fractured based on fracturing potential, said system comprising:

one or more processors; and one or more electronic storage devices comprising:

a first calculation module for the horizontal well to be fractured or each fractured horizontal well which is positioned in the same reservoir with the horizontal well to be fractured, which when executed configures said one or more processors to: obtain the value of each index of each depth point for calculating the fracturing potential value, and calculate the fracturing potential value; and calculate the fracturing potential value of each depth point by using the value of each index of each depth point to obtain the designed fracturing point or the fracturing potential value of each fracturing point;

a determination module, which when executed configures said one or more processors to determine the first corresponding relation between the fracture conductivity value and the fracturing potential value and the second corresponding relation between the fracture half length and the fracturing potential value based on the fracturing potential value and the first actual production data of each fracturing point of each fractured horizontal well calculated by the first calculating module, in which the first actual production data comprises the oil production of the fracturing point at each time step;

a simulation module, which when executed configures said one or more processors to calculate the fracture conductivity value and the fracture half length of the designed fracturing points according to the first corresponding relation and the second corresponding relation determined by the determination module and the fracturing potential value of each designed fracturing points calculated by the first calculation module for each of the candidate designs of the multiple designed fracturing points of the horizontal well to be fractured, and generate first simulated production data corresponding to the candidate designs through a numerical simulator, in which the first simulated production data comprise simulated oil production and simulated water production of each time step corresponding to each of the candidate designs;

a second calculation module, which when executed configures said one or more processors to calculate a predicted net present value corresponding to each of the candidate designs according to the first simulated production data corresponding to each of the candidate designs obtained by the simulation module and the fracture half length at each design fracturing point; and a selection module which when executed configures said one or more processors to determine and select the candidate design with the highest predicted net present value calculated by the second calculation module as the fracturing position design scheme of the horizontal well to be fractured.

8. The system of claim 7, wherein the first calculation module, when executed, configures said one or more processors to:

for each index, calculate the weight of the index according to the value of the index of each depth point; and for each depth point, calculate the fracturing potential of the depth point according to the weight and the value of each index of the depth point.

9. The system of claim 8, wherein the determination module, when executed, configures said one or more processors to:

establish a plurality of candidate models of the fracture conductivity values respectively according to the fracturing potential value of each fracturing point of the fractured horizontal well;

generate second simulated production data through a numerical simulator according to the fracture half length of each candidate model and each fracturing point respectively, in which the second simulated production data comprises simulated oil production at each time step of the target well section of the fractured horizontal well;

calculate each fitting value of the second simulated production data and the second actual production data, and selecting a candidate model corresponding to the fitting value less than a preset fitting value as a selected model; and calculate the fracture conductivity value of each fracturing point of the fractured horizontal well according to the selected model.

10. The system of claim 7, wherein the determination module, when executed, configures said one or more processors to:

for each fractured horizontal well, calculate the fracture half length of each fracturing point according to the first actual production data of each fracturing point of the fractured horizontal well; and calculate the fracture conductivity value of each fracturing point according to the fracturing potential value and the fracture half length of each fracturing point of the fractured horizontal well; and train and learn based on fracture conductivity values and fracturing potential values of each fracturing point of plurality of fractured horizontal wells to obtain the first corresponding relation between the fracture conductivity values and the fracturing potential values; and train and learn based on the fracture half length and the fracturing potential value of each fracturing point of the plurality of fractured horizontal wells to obtain the second corresponding relation between the fracture half length and the fracturing potential value.

11. The system of claim 7, wherein the second calculation module, when executed, configures said one or more processors to:
calculate a predicted net present value for the each of the candidate designs using the equation:

$$NPV = \sum_{j2=1}^{n5} \left( \frac{(Q_o^{j2} r_g - Q_w^{j2} r_w) \Delta t_{j2}}{(1+b)^{\frac{t_{j2}}{365}}} \right) - \sum_{i6=1}^{n6} 2 X_{i6} C$$

wherein, NPV is the predicted net present value corresponding to the candidate design; j2 is the j2$^{th}$ time step of the first simulated production data, j2=1, 2 ... n5, n5 is number of time steps in first simulated production data; $r_g$ and $r_w$ are the price of oil per unit volume and the price of water per unit volume to be treated respectively; $t_{j2}$ is the time point corresponding to the j2$^{th}$ time step; $\Delta t_{j2}$ is the length of the time step; b is the discount rate; C is the fracturing cost of per unit fracturing length; $Q_o^{j2}$ and $Q_w^{j2}$ are the simulated oil production and the simulated water production at the j2$^{th}$ time stop in the first simulated production data respectively; $X_{i6}$ is the fracture half length of the i6$^{th}$ design fracturing point, i6=1, 2 ... n6, n6 is the number of design fracturing points corresponding to the candidate design.

* * * * *